(12) United States Patent
Opris

(10) Patent No.: US 6,801,151 B1
(45) Date of Patent: Oct. 5, 2004

(54) METHOD AND APPARATUS FOR ANALOG-TO-DIGITAL PIPELINE CONVERSION

(76) Inventor: Ion E. Opris, 2198 Lark Hills Ct., San Jose, CA (US) 95138

( * ) Notice: Subject to any disclaimer, the term of this patent is extended or adjusted under 35 U.S.C. 154(b) by 0 days.

(21) Appl. No.: 10/642,713

(22) Filed: Aug. 18, 2003

(51) Int. Cl.$^7$ ................................................ H03M 1/38
(52) U.S. Cl. ...................................... 341/161; 341/150
(58) Field of Search ................................ 341/161, 162, 341/163, 155, 122

(56) References Cited

U.S. PATENT DOCUMENTS

| | | | | |
|---|---|---|---|---|
| 4,611,196 A | * | 9/1986 | Fernandez | 341/158 |
| 5,995,035 A | * | 11/1999 | Signell et al. | 341/163 |
| 6,313,779 B1 | * | 11/2001 | Leung et al. | 341/155 |
| 6,606,042 B2 | * | 8/2003 | Sonkusale et al. | 341/120 |

* cited by examiner

*Primary Examiner*—Peguy JeanPierre
(74) *Attorney, Agent, or Firm*—Florin Alin Corie (57) ABSTRACT

A method and apparatus for analog-to-digital pipeline conversion are described. The apparatus includes a sample/hold circuit having an input to receive an analog input voltage, a comparator device coupled to the input of the sample/hold circuit to receive the analog input voltage, and a separate gain circuit coupled to an output of the sample/hold circuit and to the comparator device. The sample/hold circuit and the comparator device sample the analog input voltage and the separate gain circuit amplifies an analog residue voltage obtained from the analog input voltage to obtain an amplified analog residue voltage in a first phase of a non-overlapping clock. The analog residue voltage is obtained in a second phase of the non-overlapping clock, when the sample/hold circuit holds the analog input voltage sampled in the first phase, and the comparator device compares the analog input voltage sampled in the first phase with a reference voltage value.

11 Claims, 6 Drawing Sheets

METHOD AND APPARATUS FOR ANALOG-TO-DIGITAL PIPELINE CONVERSION

FIELD OF THE INVENTION

The present invention relates generally to electronic circuits and, more particularly, to a method and apparatus for analog-to-digital pipeline conversion.

BACKGROUND OF THE INVENTION

An N-bit algorithmic analog-to-digital (A/D) converter, either a pipeline or cyclic converter, generally includes a predetermined number J of conversion stages, each conversion stage being a K-bit stage, where J×K=N.

Figure 1:
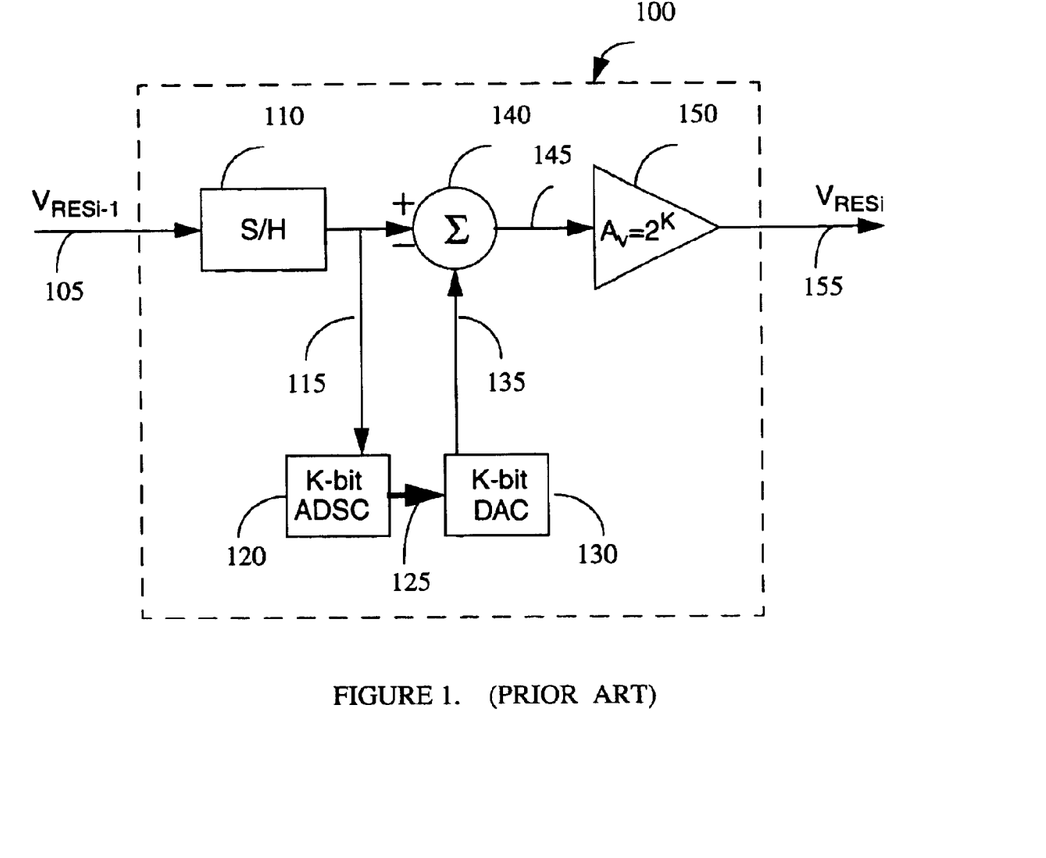
FIG. 1 is a block diagram illustrating a prior art conversion stage of a pipeline analog-to-digital (A/D) converter.

FIG. 1 is a block diagram illustrating a prior art conversion stage of a pipeline analog-to-digital (A/D) converter. As illustrated in FIG. 1, the conversion stage 100 includes a sample/hold S/H module 110 to receive an analog input voltage $V_{RESi-1}$ 105, a K-bit A/D subconverter module ADSC 120 coupled to an output of the S/H module 110 to estimate the analog input voltage $V_{RESi-1}$ 105 into a digital signal 125 by extracting a predetermined number K of bits from the $V_{RESi-1}$ 105, and a K-bit digital-to-analog (D/A) converter DAC 130 coupled to the ADSC 120 to receive the K-bit signal 125 from the ADSC 120 and to create an analog estimate $V_{DACi}$ 135 of the input voltage $V_{RESi-1}$ 105. A summing circuit 140 coupled to the S/H module 110 and to the DAC 130 subsequently subtracts the analog estimate $V_{DACi}$ 135 from the analog input voltage $V_{RESi-1}$ 105 and transmits the resulting analog residue voltage 145 to an amplifier module $A_V$ 150. The $A_V$ 150 amplifies the residue voltage 145 by a $2^K$ factor to obtain an amplified residue voltage $V_{RESi}$ 155 and transmits the voltage $V_{RESi}$ 155 to a subsequent conversion stage (not shown) of the A/D converter. The amplified residue voltage 155 can be calculated with the formula $$V_{RESi} = 2^K \times V_{RESi-1} - V_{DACi}$$

In any algorithmic A/D converter, the overall linearity of the converter is generally determined by the linearity of the DAC 130 of each conversion stage 100. Thus, a solution designed especially for high linearity and high speed applications uses K=1 and a 1-bit ADSC 120 and DAC 130. With a single-bit decision, there is always a straight line that can be drawn between the positive and negative reference voltages. In this case, the ideal gain of the conversion stage 100 is 2 and the residue equation becomes $$V_{RESi} = 2 \times V_{RESi-1} - V_{DACi}$$

Figure 2:
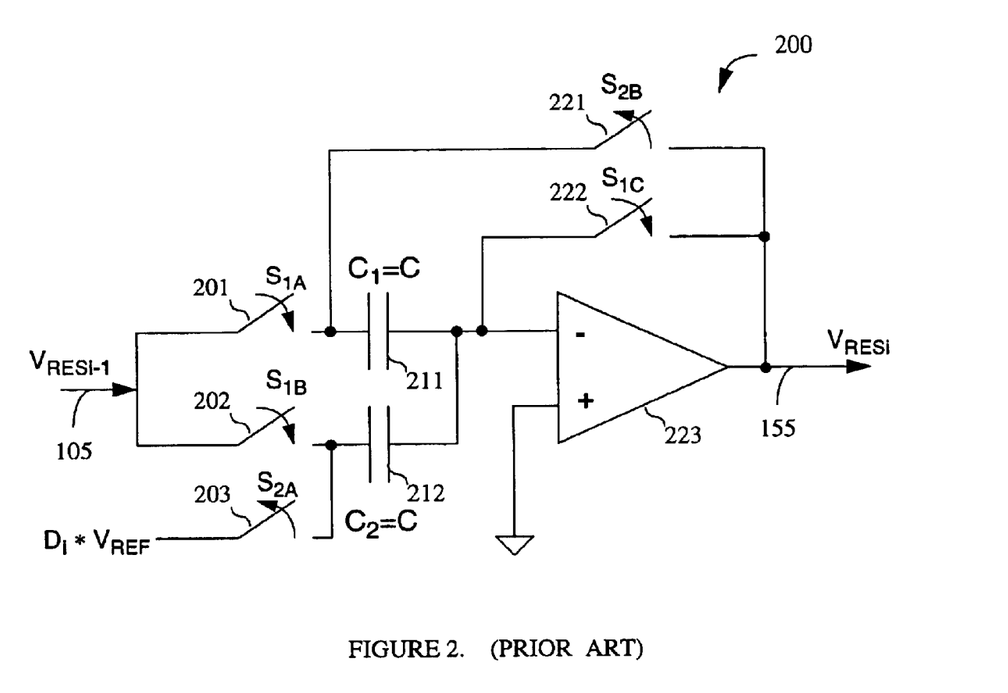
FIG. 2 is a schematic diagram illustrating a prior art analog residue computation circuit.

FIG. 2 is a schematic diagram illustrating a prior art analog residue computation circuit. As illustrated in FIG. 2, the circuit 200 combines the S/H module 110, the ADSC 120, the DAC 130, and the summing circuit 140 shown in the conversion stage of FIG. 1 into a single switched capacitor circuit 200.

During a first phase of a non-overlapping clock, known as the sample phase, a switch $S_{1C}$ 222 holds operational amplifier 223 as a voltage follower and the analog input voltage $V_{RESi-1}$ 105 minus the offset of the operational amplifier 223 is sampled on both capacitors 211 and 212 through switches $S_{1A}$ 201 and $S_{1B}$ 202, respectively.

During a second phase of the non-overlapping clock, known as the hold phase, the bottom plate of the capacitor 211 is coupled to the output of the operational amplifier 223 through switch $S_{2B}$ 221 and the bottom plate of the capacitor 212 is coupled to $D_i \times V_{REF}$ through switch $S_{2A}$ 203, where the data $D_i$ is the data input and can take one of two values, −1 or +1, at any given pipeline stage.

The speed of the pipeline A/D converter is determined by the speed of a single conversion stage 100 illustrated in FIG. 1. The alternating conversion stages 100 of the converter work on alternating phases of the clock, such that, in any phase, half of the conversion stages 100 are in the hold phase and half are in the sample phase. Thus, for correct functionality, the sample phase of one conversion stage 100 must end after the residue voltage transmitted from the previous conversion stage 100 (in hold phase), for example, the analog residue voltage $V_{RESi-1}$ 105 in FIG. 1, has settled to its final value. Otherwise, for example, if the conversion clock is too fast, the residue value transferred to the next conversion stage 100 will be incorrect. As a result, high speed converters require conversion stages 100 with fast settling times.

For switched capacitor implementations, such as the circuit 200 illustrated in FIG. 2, assuming a single dominant-pole operational amplifier 223, the settling time to within N bits of accuracy is determined by the formula $$T_S = N \times ln(2) \times C_L / \beta \times g_M$$

where $g_M/C_L$ is the dominant pole of the operational amplifier 223 and $\beta$ is the feedback factor (feedback gain). Thus, for high speed converters having small feedback factor $\beta$, what is needed is a method and apparatus that minimizes the settling time.

Figure 3:
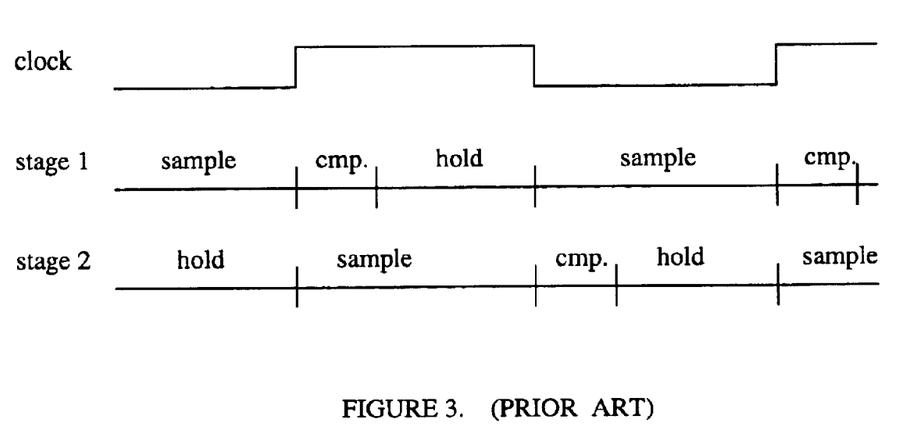
FIG. 3 is a timing diagram illustrating the timing of two consecutive prior art conversion stages of a pipeline A/D converter.

Another perceived limitation of the high speed pipeline A/D converters is the comparator ADSC 120 decision time. FIG. 3 is a timing diagram illustrating the timing of two consecutive prior art conversion stages of a pipeline A/D converter. As shown in FIG. 3, after the end of the sample phase, the conversion stage 100 has to execute first a compare phase. The settling phase of the operational amplifier 223 cannot start before the completion of the compare phase because there is no information about the region of the residue voltage conversion. On the other hand, the compare phase has to have a correct input; therefore it has to wait for the previous conversion stage to settle. Thus, what is needed is a method and apparatus in which the comparator decision time is not a major limitation on the conversion clock at high speeds.

SUMMARY OF THE INVENTION

A method and apparatus for analog-to-digital pipeline conversion are described. The apparatus includes a sample/hold circuit having an input to receive an analog input voltage, a comparator device coupled to the input of the sample/hold circuit to receive the analog input voltage, and a separate gain circuit coupled to an output of the sample/hold circuit and to the comparator device. The sample/hold circuit and the comparator device sample the analog input voltage and the separate gain circuit amplifies an analog residue voltage obtained from the analog input voltage to obtain an amplified analog residue voltage in a first phase of a non-overlapping clock. The analog residue voltage is obtained in a second phase of the non-overlapping clock, when the sample/hold circuit holds the analog input voltage sampled in the first phase, and the comparator device compares the analog input voltage sampled in the first phase with a reference voltage value.

Other features and advantages of the present invention will be apparent from the accompanying drawings, and from the detailed description, which follows below.

BRIEF DESCRIPTION OF THE DRAWINGS

The present invention is illustrated by way of example and not intended to be limited by the figures of the accompanying drawings in which like references indicate similar elements and in which.

DETAILED DESCRIPTION

According to embodiments described herein, a method and apparatus for analog-to-digital (A/D) pipeline conversion are described. The apparatus includes a sample/hold circuit having an input to receive an analog input voltage, a comparator device coupled to the input of the sample/hold circuit to receive the analog input voltage, and a separate gain circuit coupled to an output of the sample/hold circuit and to the comparator device. The sample/hold circuit and the comparator device sample the analog input voltage and the separate gain circuit amplifies an analog residue voltage obtained from the analog input voltage to obtain an amplified analog residue voltage in a first phase of a non-overlapping clock. The analog residue voltage is obtained in a second phase of the non-overlapping clock, when the sample/hold circuit holds the analog input voltage sampled in the first phase, and the comparator device compares the analog input voltage sampled in the first phase with a reference voltage value.

In the following detailed description of embodiments of the invention, reference is made to the accompanying drawings in which like references indicate similar elements, and in which are shown by way of illustration specific embodiments in which the invention may be practiced. These embodiments are described in sufficient detail to enable those skilled in the art to practice the invention, and it is to be understood that other embodiments may be utilized and that logical, mechanical, electrical, functional, and other changes may be made without departing from the scope of the present invention. The following detailed description is, therefore, not to be taken in a limiting sense, and the scope of the present invention is defined only by the appended claims. In the following detailed description, for simplicity purposes, the present invention is described in a single ended implementation. However, it is to be understood, that a fully differential implementation may be also be used with the present invention.

Figure 4:
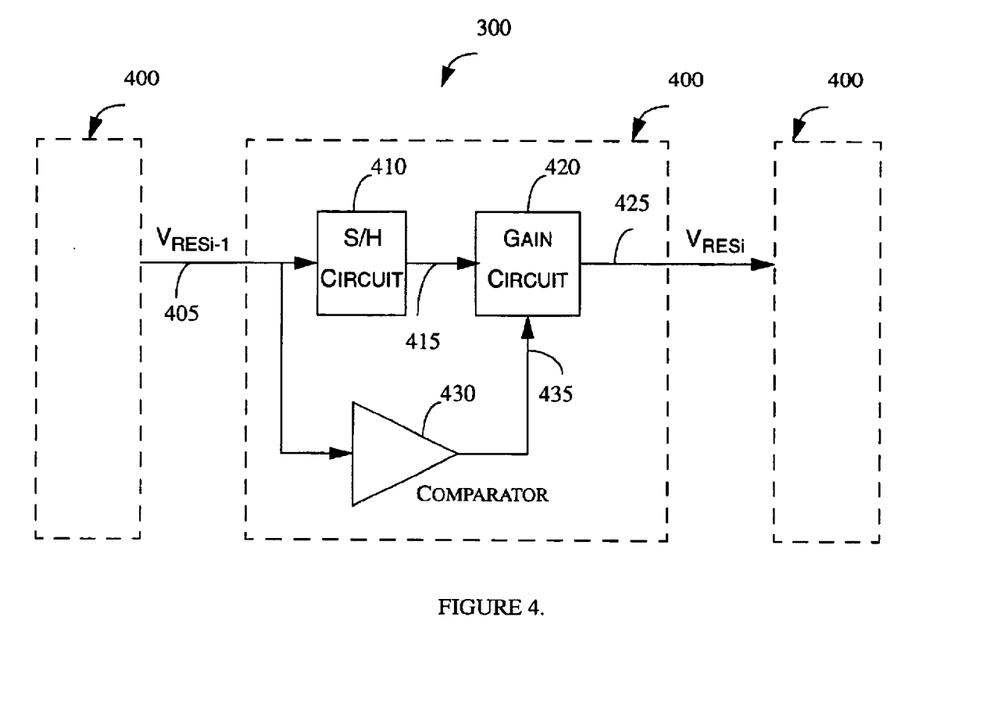
FIG. 4 is a block diagram illustrating an apparatus for A/D pipeline conversion, according to one embodiment of the present invention.

FIG. 4 is a block diagram illustrating an apparatus for A/D pipeline conversion 300, according to one embodiment of the present invention. As illustrated in FIG. 4, in one embodiment, the apparatus 300 includes multiple conversion stages 400, each conversion stage 400 performing conversion operations on the same phase of a non-overlapping clock.

In one embodiment, each conversion stage 400 includes a sample/hold circuit 410 to receive an analog input voltage $V_{RESi-1}$ 405 from a previous conversion stage 400 and to perform sample and hold functions on the input voltage 405 and a comparator device 430 coupled to an input of the sample/hold circuit 410 to receive the analog input voltage $V_{RESi-1}$ 405 and to perform comparison functions on the analog input voltage 405 simultaneously with the hold functions performed by the sample/hold circuit 410. In addition, both the comparator device 430 and the sample/hold circuit 410 perform sample functions on the analog input voltage 405 on the same phase of the clock, as described in further detail below in connection with FIGS. 5 and 6.

In on embodiment, the conversion stage 400 further includes a separate gain circuit 420 coupled to an output of the sample/hold circuit 410 and an output of the comparator device 430. The gain circuit 420 performs hold and amplification functions on the same phase of the clock when the comparator device 430 and the sample/hold circuit 410 perform sample functions on the analog input voltage 405, as described in further detail below.

Figure 5:
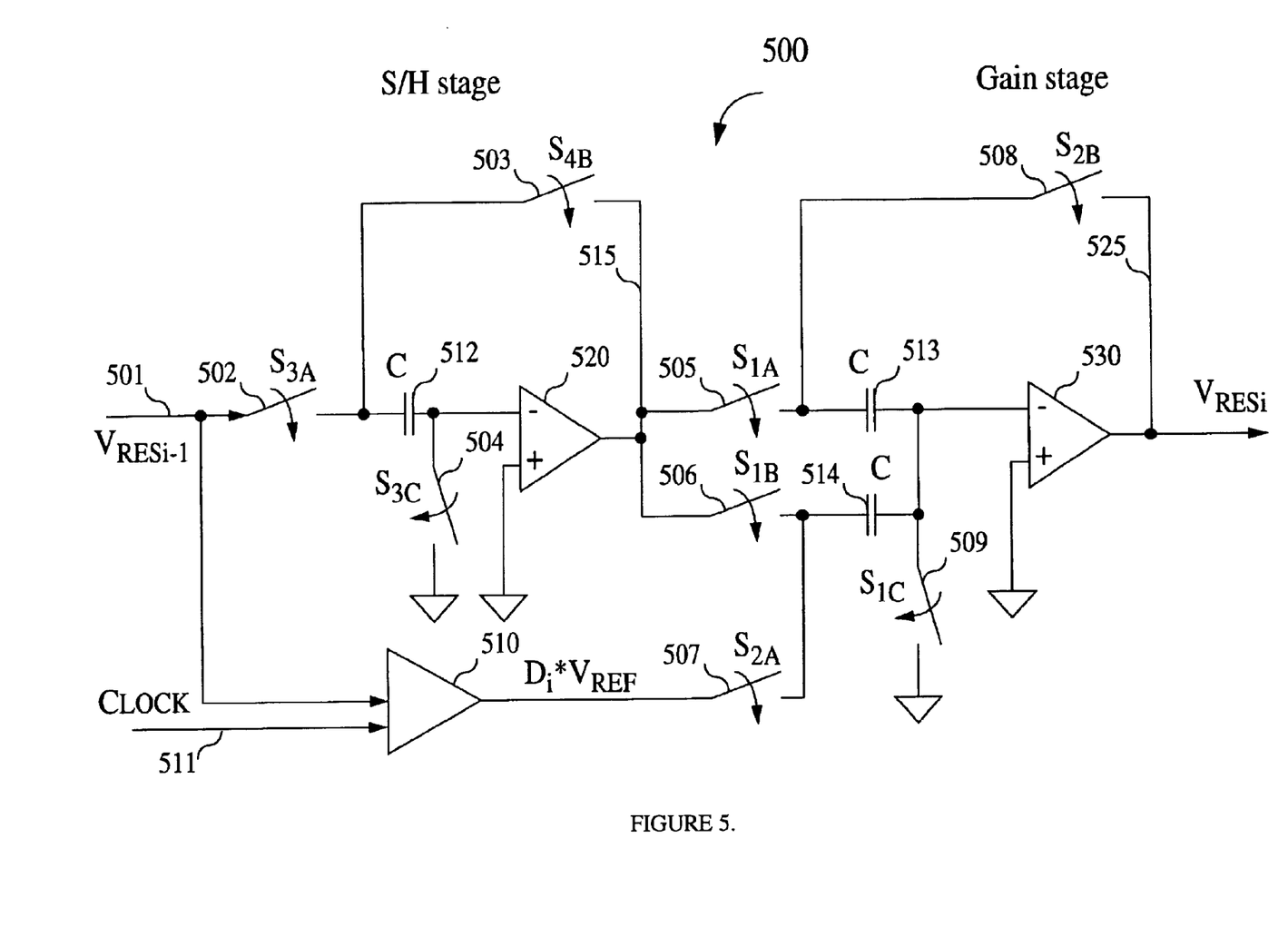
FIG. 5 is a schematic diagram illustrating one implementation of a conversion stage of the apparatus for A/D pipeline conversion of the present invention.

FIG. 5 is a schematic diagram illustrating one implementation of a conversion stage of the apparatus for A/D pipeline conversion of the present invention. As illustrated in FIG. 5, in one embodiment, in the conversion stage 500, the sample/hold circuit 410 shown in FIG. 4 includes switches $S_{3A}$ 502, $S_{4B}$ 503, and $S_{3C}$ 504, and an amplifier module 520 having one input coupled to a capacitor 512 and the other input coupled to ground. The gain circuit 420 shown in FIG. 4 includes switches $S_{1A}$ 505, $S_{1B}$ 506, $S_{2A}$ 507, $S_{2B}$ 508, and $S_{1C}$ 509, and an amplifier module 530 having one input coupled to capacitors 513 and 514 and a second input coupled to ground. In one embodiment, a comparator device 510 is coupled to the input of the conversion stage 500 to receive the analog input voltage $V_{RESi-1}$ 501 and to switch $S_{2A}$ 507. A clock signal 511 prompts the comparator device 510 to switch from performance of sample operations to comparison operations and vice-versa.

Figure 6:
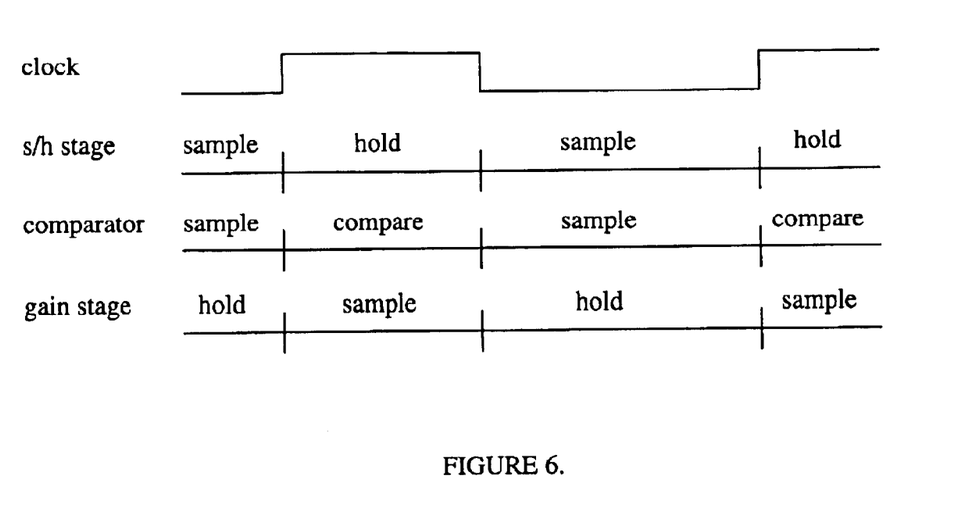
FIG. 6 is a timing diagram illustrating the A/D conversion timing of the apparatus for A/D pipeline conversion of the present invention.

FIG. 6 is a timing diagram illustrating the A/D conversion timing of the apparatus for A/D pipeline conversion of the present invention. As illustrated in FIGS. 5 and 6, in one embodiment, in a first phase of the non-overlapping clock, when the clock 511 transitions from high to low, switches $S_{3A}$ 502, $S_{3C}$ 504, $S_{2A}$ 507, and $S_{2B}$ 508 close. Thus, the capacitor 512 is coupled to the input of the conversion stage 500 and samples the input voltage $V_{RESi-1}$ 501. At the same time, the capacitor 513 is coupled to the output of the conversion stage 500 and the capacitor 514 is coupled to the comparator device 510 and a reference voltage $D_i \times V_{REF}$. The comparator device 510 samples the input voltage $V_{RESi-1}$ 501 as well, while the amplifier module 530 performs hold and amplification functions on an analog residue voltage sampled by the capacitor 513 in a previous phase of the clock, as described in further detail below, in order to obtain and to output an amplified analog residue voltage. As a result, the hold time of the gain circuit 420 shown in FIG. 4 can be extended over the full phase of the clock, when both the sample/hold circuit 410 and the comparator device 510 perform sample operations on the input voltage $V_{RESi-1}$ 501.

In one embodiment, in a second phase of the non-overlapping clock, when the clock 511 transitions from low to high, switches $S_{4B}$ 503, $S_{1A}$ 505, $S_{1B}$ 506, and $S_{1C}$ 509 close. Thus, the amplifier module 520 is disconnected and in a hold state and the capacitor 513 samples the output of the amplifier module 520. On the clock transition to high, the comparator device 510 compares the sample of the analog voltage $V_{RESi-1}$ 501 with a reference voltage value $D_i \times V_{REF}$ for the entire phase of the clock, until the next clock transition to low. Since the timing of the comparator device 510 is not critical, a lower power approach may be used in the A/D pipeline conversion apparatus 300.

In one embodiment, the duty cycle of the clock 511 can be skewed, as shown in FIG. 6. This arrangement increases the settling time in the gain circuit 420 and conversely decreases the settling time (hold state) in the sample/hold circuit 410. However, since the sample/hold circuit 410 has a higher feedback factor β, its settling time should be faster than the settling time of the gain circuit 420.

In one embodiment, the capacitive load of the gain circuit 420 is a single capacitor from the sample/hold circuit 410 of a subsequent conversion stage 500, and, therefore, the speed of the gain circuit 420 is increased. Thus, the maximum operating clock frequency can be increased in the A/D pipeline apparatus 300 by 70–100 percent using one of many known techniques for changing the clock duty factor, such as, for example, using delay lock loops or by simply adding a fixed delay to the clock 511.

In one embodiment, the present invention may be implemented with a dual input differential amplifier device, as described in detail in U.S. patent application Ser. No. 10/351,150, filed on Jan. 24, 2003, and entitled "Dual Input Differential Amplifier," which is incorporated by reference herein.

It is to be understood that embodiments of the present invention may be implemented not only within a physical circuit (e.g., on semiconductor chip) but also within machine-readable media. For example, the circuits and designs discussed above may be stored upon and/or embedded within machine-readable media associated with a design tool used for designing semiconductor devices. Examples include a netlist formatted in the VHSIC Hardware Description Language (VHDL) language, Verilog language or SPICE language. Some netlist examples include: a behavioral level netlist, a register transfer level (RTL) netlist, a gate level netlist and a transistor level netlist. Machine-readable media also include media having layout information such as a GDS-II file. Furthermore, netlist files or other machine-readable media for semiconductor chip design may be used in a simulation environment to perform the methods of the teachings described above. Thus, it is also to be understood that embodiments of this invention may be used as or to support a software program executed upon some form of processing core (such as the CPU of a computer) or otherwise implemented or realized upon or within a machine-readable medium. A machine-readable medium includes any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. An apparatus comprising:
   a sample/hold circuit having an input to receive an analog input voltage;
   a comparator device coupled to said input of said sample/hold circuit to receive said analog input voltage; and
   a separate gain circuit coupled to an output of said sample/hold circuit and to said comparator device;
   said sample/hold circuit and said comparator device to sample said analog input voltage and said separate gain circuit to amplify an analog residue voltage obtained from said analog input voltage to obtain an amplified analog residue voltage in a first phase of a non-overlapping clock.

2. The apparatus according to claim 1, wherein said analog residue voltage is obtained in a second phase of said non-overlapping clock, when said sample/hold circuit holds said analog input voltage sampled in said first phase, and said comparator device compares said analog input voltage sampled in said first phase with a reference voltage value.

3. The apparatus according to claim 2, wherein said first phase and said second phase of said clock have unequal timing periods.

4. The apparatus according to claim 3, wherein said first phase timing period is longer than said second phase timing period.

5. The apparatus according to claim 1, wherein said separate gain circuit amplifies said analog residue voltage over said entire first phase of said clock.

6. An apparatus for performing analog-to-digital pipeline conversion, said apparatus comprising
   a plurality of conversion stages, each conversion stage comprising:
   a sample/hold circuit having an input to receive an analog input voltage from a prior adjacent conversion stage of said plurality of conversion stages;

a comparator device coupled to said input of said sample/hold circuit to receive said analog input voltage; and a separate gain circuit coupled to an output of said sample/hold circuit and to said comparator device;

said sample/hold circuit and said comparator device to sample said analog input voltage and said separate gain circuit to amplify an analog residue voltage obtained from said analog input voltage to obtain an amplified analog residue voltage in a first phase of a non-overlapping clock, said gain circuit to output said amplified analog residue voltage to a subsequent adjacent conversion stage of said plurality of conversion stages.

7. The apparatus according to claim 6, wherein said analog residue voltage is obtained in a second phase of said non-overlapping clock, when said sample/hold circuit holds said analog input voltage sampled in said first phase, and said comparator device compares said analog input voltage sampled in said first phase with a reference voltage value.

8. The apparatus according to claim 7, wherein said first phase and said second phase of said clock have unequal timing periods.

9. The apparatus according to claim 8, wherein said first phase timing period is longer than said second phase timing period.

10. The apparatus according to claim 6, wherein said separate gain circuit amplifies said analog residue voltage over said entire first phase of said clock.

11. A method comprising:

coupling a comparator device to an input of a sample/hold circuit in an analog-to-digital conversion apparatus; and coupling a separate gain circuit to said comparator device and to an output of said sample/hold circuit;

said sample/hold circuit and said comparator device to receive an analog input voltage and to sample said analog input voltage, and said separate gain circuit to amplify an analog residue voltage obtained from said analog input voltage to obtain an amplified analog residue voltage in a first phase of a non-overlapping clock.

* * * * *